(12) United States Patent
Caraher et al.

(10) Patent No.: US 10,720,224 B2
(45) Date of Patent: Jul. 21, 2020

(54) PROTOCOL INDEPENDENT TESTING OF MEMORY DEVICES USING A LOOPBACK

(71) Applicant: Micron Technology, Inc., Boise, ID (US)

(72) Inventors: Patrick Caraher, Niwot, CO (US); Michael B. Danielson, Georgetown, TX (US)

(73) Assignee: MICRON TECHNOLOGY, INC., Boise, ID (US)

( * ) Notice: Subject to any disclaimer, the term of this patent is extended or adjusted under 35 U.S.C. 154(b) by 84 days.

(21) Appl. No.: 16/038,517

(22) Filed: Jul. 18, 2018

(65) Prior Publication Data

US 2020/0027518 A1 Jan. 23, 2020

(51) Int. Cl.
*G11C 29/00* (2006.01)
*G11C 29/12* (2006.01)
*G11C 29/36* (2006.01)

(52) U.S. Cl.
CPC .......... *G11C 29/12015* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 6,760,873 B1* | 7/2004 | Hao | ................ | G01R 31/3016 324/73.1 |
| 7,363,563 B1* | 4/2008 | Hissen | ................ | H04L 1/243 327/144 |
| 7,743,288 B1* | 6/2010 | Wang | ................ | G01R 31/3171 714/703 |
| 7,756,197 B1 | 7/2010 | Ferguson et al. | | |
| 2002/0105353 A1* | 8/2002 | Mori | ................ | G01R 31/31716 324/750.01 |
| 2014/0229782 A1* | 8/2014 | Rueter | ............ | G01R 31/31919 714/733 |
| 2016/0204881 A1* | 7/2016 | Chung | ................ | H04B 17/00 455/67.14 |

OTHER PUBLICATIONS

M. Lin, Kwang-Ting Cheng, J. Hsu, M. C. Sun, J. Chen and S. Lu, "Production-oriented interface testing for PCI-Express by enhanced loop-back technique," IEEE International Conference on Test, 2005., Austin, TX, 2005, pp. 10 pp. 670. (Year: 2005).*
International Search Report and Written Opinion, PCT App. No. PCT/US2019/041864, dated Nov. 6, 2019, 12 pages.

* cited by examiner

*Primary Examiner* — Daniel F. McMahon
(74) *Attorney, Agent, or Firm* — Nicholson De Vos Webster & Elliott LLP

(57) ABSTRACT

A device under test for performing built-in self-tests to determine the functionality of one or more components of the device under test is described. The device under test includes a storage location to store a set of tests for testing the device under test; a data generator to generate a test pattern based on a test in the set of tests; a transmission unit to transmit the test pattern to a test system; a receiver unit to receive a set of loopback signals from the test system, wherein the set of loopback signals represent the test pattern; and a data checker to determine success or failure of the device under test based on the set of loopback signals.

18 Claims, 9 Drawing Sheets

PROTOCOL INDEPENDENT TESTING OF MEMORY DEVICES USING A LOOPBACK

TECHNICAL FIELD

The present disclosure generally relates to memory device testing, and more specifically, relates to a protocol independent approach for testing memory devices using a loopback.

BACKGROUND ART

A memory subsystem can be a storage system, such as a solid-state drive (SSD), and can include one or more memory components that store data. The memory components can be, for example, non-volatile memory components and volatile memory components. In general, a host system can utilize a memory subsystem to store data in the memory components and to retrieve data from the memory components.

Test systems are often used to determine whether memory subsystems are properly functioning/performing before delivery of these memory subsystems to consumers. These test systems are conventionally designed to include an interface of the device under test (i.e., the memory subsystem), including the interface protocol of the device under test. Accordingly, the test system must be configured to support the protocol of devices under test. However, implementing the test system to include the constantly evolving protocol of the device under test can be an arduous process that ultimately results in a costlier test system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
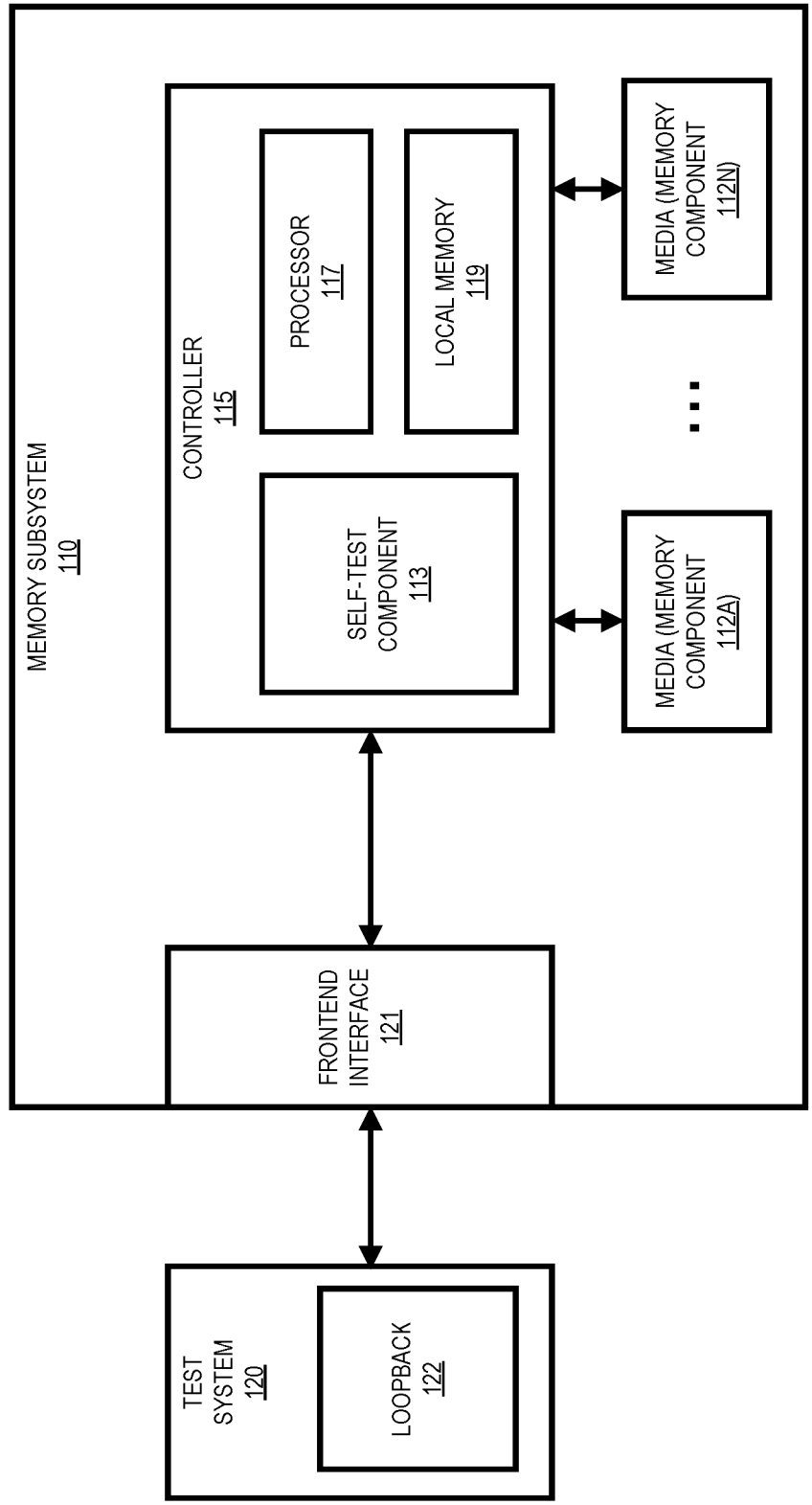
FIG. 1 illustrates an example testing environment that includes a memory subsystem, in accordance with some embodiments of the present disclosure.

Aspects of the present disclosure are directed to a test system for a memory subsystem. A memory subsystem is also hereinafter referred to as a "memory device". An example of a memory subsystem is a storage system, such as a solid-state drive (SSD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

Prior to delivery to consumers, manufacturers perform rigorous testing of memory subsystems using test systems. In particular, a memory subsystem (sometimes referred herein as a device under test) is coupled to a test system via a frontend interface of the memory subsystem. For example, a frontend interface of a device under test may be one of a serial advanced technology attachment (SATA) interface, a mini-SATA (mSATA) interface, a peripheral component interconnect express (PCIe) interface, a serial attached small computer system interface (SCSI) (SAS), or a non-volatile memory express (NVMe) interface. The test system can include a complimentary frontend interface for communicating with the device under test, including the full protocol stack of the frontend interface of the device under test. The test system determines the functionality and structural integrity of the device under test by applying test stimuli via the frontend interface. In particular, the device under test is loaded with standard firmware, which will be installed on the device under test upon delivery to a consumer, and the test system simulates typical commands/requests from a host system (e.g., read and write commands/requests), which may be encountered during use of the device under test by a consumer. The test system passes the simulated commands/requests to the device under test using the full protocol stack of the frontend interface. The test system analyzes responses to these commands/requests from the device under test to determine the functionality and/or structural integrity of one or more components of the device under test (e.g., the frontend interface of the device under test). Accordingly, these test systems must implement the full protocol stack (e.g., the entirety of the hardware and software/firmware stack) of the frontend interface of the device under test. In some cases, test engineers must update the protocol stack of the test system as updates are made to the protocol of the frontend interface.

Further simulating typical commands/requests from a host system to determine the functionality and/or structural integrity of the device under test may be time-intensive. Namely, the test system may need to pass numerous commands/requests to the device under test to determine performance of components of the device under test. This is particularly difficult when the protocol of the frontend interface avoids worst case symbols and symbol sequences, which are sought by the test system to detect latent defects in the device under test (i.e., safeguards in the protocol of the frontend interface make it difficult for the test system to stress test the device under test both in terms of timing and voltage). Based on safeguards in the protocol, there can be no guarantee that the test operations/scenarios contemplated were in fact simulated by the test system.

Aspects of the present disclosure address the above and other deficiencies by instructing/configuring the device under test or the test system to use loopbacks to determine the functionality and/or integrity of components of the device under test. In particular, the device under test is coupled to a test system and a set of diagnostics tests are loaded onto one of the device under test and the test system. The device onto which the set of tests are loaded is the transmitting device and the other device is the receiving device, which will loopback received data/signals to the transmitting device. For example, a test loaded onto the device under test can instruct the device under test (i.e., the transmitting device) to generate and transmit a test pattern to the test system (i.e., the receiving device). A loopback enabled in the test system routes a set of signals representing the test pattern back to the device under test with minimal or no processing by the test pattern. Namely, the device under test and the test system exchange signals without adherence to a protocol or another standard. The device under test can thereafter process and compare the received set of signals in relation to signals representing the original test pattern to determine the functionality and/or structural integrity of the frontend interface of the device under test. Because the transmission and loopback between the test system and the device under test are performed irrespective of a protocol, the test system does not implement a protocol of the device under test and the device under test does not need to adhere to a protocol, including updating the test system to comply with corresponding updates to the protocol. Namely, the device under test can transmit test patterns to cover outlier cases or error conditions without consideration to safeguards in a protocol that will alter/correct these transmissions. The above examples are merely illustrative and additional embodiments will be described below.

FIG. 1 illustrates an example testing environment 100 that includes a memory subsystem 110 in accordance with some embodiments of the present disclosure. The memory subsystem 110 shown in FIG. 1 can be a device under test in a test environment that will be described in greater detail below. The memory subsystem 110 can include media, such as memory components 112A to 112N. The memory components 112A to 112N can be volatile memory components, non-volatile memory components, or a combination of such. In some embodiments, the memory subsystem 110 is a storage system. An example of a storage system is a solid-state drive (SSD). In some embodiments, the memory subsystem 110 is a hybrid memory/storage subsystem. In general, the testing environment 100 can include a test system 120 that is used to test the memory subsystem 110. For example, the test system 120 can transmit and receive data/signals to/from the memory subsystem 110. In some embodiments, as will be described in greater detail below, the test system 120 includes a passive or an active loopback 122 for routing data/signals received from the memory subsystem 110 back to the memory subsystem 110. Alternatively, the memory subsystem 110 includes a loopback for routing data/signals received from the test system 120 back to the test system 120. In either case, as will be described in greater detail below, the looping/routing back of signals to the transmitting/originating device provides a technique for testing the memory subsystem 110 with minimal cost (both in terms of financial and implementation/complexity costs).

The test system 120 can be a computing device such as a desktop computer, laptop computer, network server, mobile device, or such computing device that includes a memory and a processing device. However, in other embodiments, the test system 120 can be a passive set of circuits and/or other electrical components (e.g., a set of capacitors on a printed circuit board). The test system 120 can include or be coupled to the memory subsystem 110 so that the test system 120 can transmit and receive data/signals to/from the memory subsystem 110. The test system 120 can be coupled to the memory subsystem 110 via a physical frontend interface 121 of the memory subsystem 110. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical frontend interface 121 include, but are not limited to, a serial advanced technology attachment (SATA) interface, a peripheral component interconnect express (PCIe) interface, universal serial bus (USB) interface, Fibre Channel, Serial Attached SCSI (SAS), etc. The frontend interface 121 can be used to transmit data/signals between the test system 120 and the memory subsystem 110. During normal operation, a host system can utilize an NVM Express (NVMe) interface to access elements of the memory subsystem 110, including the memory components 112A to 112N, when the memory subsystem 110 is coupled with the host system by the PCIe interface. The frontend interface 121 can provide an interface for passing control, address, data, and other signals between the memory subsystem 110 and the host system.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by a host system. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the test system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115 and may instead rely upon external control (e.g., provided by an external host or by a processor or controller separate from the memory subsystem 110).

In general, the controller 115 can receive data or operations from a host system, when loaded with consumer/host firmware, and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include the frontend interface 121 to communicate with a host system and/or the test system 120. During normal operation with a host system of a consumer, the frontend interface 121 can convert the commands received from a host system into command instructions to access the memory components 112A to 112N as well as convert responses associated with the memory components 112A to 112N into information for the host system. However, when operating in a test mode (e.g., when loaded with diagnostic firmware/software instead of consumer-oriented firmware/software), the frontend interface 121 can avoid conversions performed on data/signals transmitted to the test system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

In some embodiments, the memory subsystem 110 includes self-test component 113 that stores a set of tests for testing the memory subsystem 110, including testing the frontend interface 121 of the memory subsystem 110. As shown in FIG. 1, the controller 115 can include a processor 117 (i.e., a processing device) configured to execute instructions stored in local memory 119 for performing the operations described herein, including the operations of the self-test component 113 (e.g., operations of tests stored in or otherwise associated with the self-test component 113).

The self-test component 113, in conjunction with a loopback in either the test system 120 (i.e., the loopback 122) or the frontend interface 121 of the memory subsystem 110, can reduce the expense of the test system 120; reduce the complexity of the test system 120, including the complexity of updating the test system 120 in response to updates to the memory subsystem 110; reduce times for testing the memory subsystem 110; provide consistent testing methodologies across product families (e.g., for different types or versions of the memory subsystem 110); and enable full signal integrity testing in high volume manufacturing to determine jitter and voltage margin. Further details with regards to the operations of the self-test component 113 and loopbacks are described below.

Figure 2:
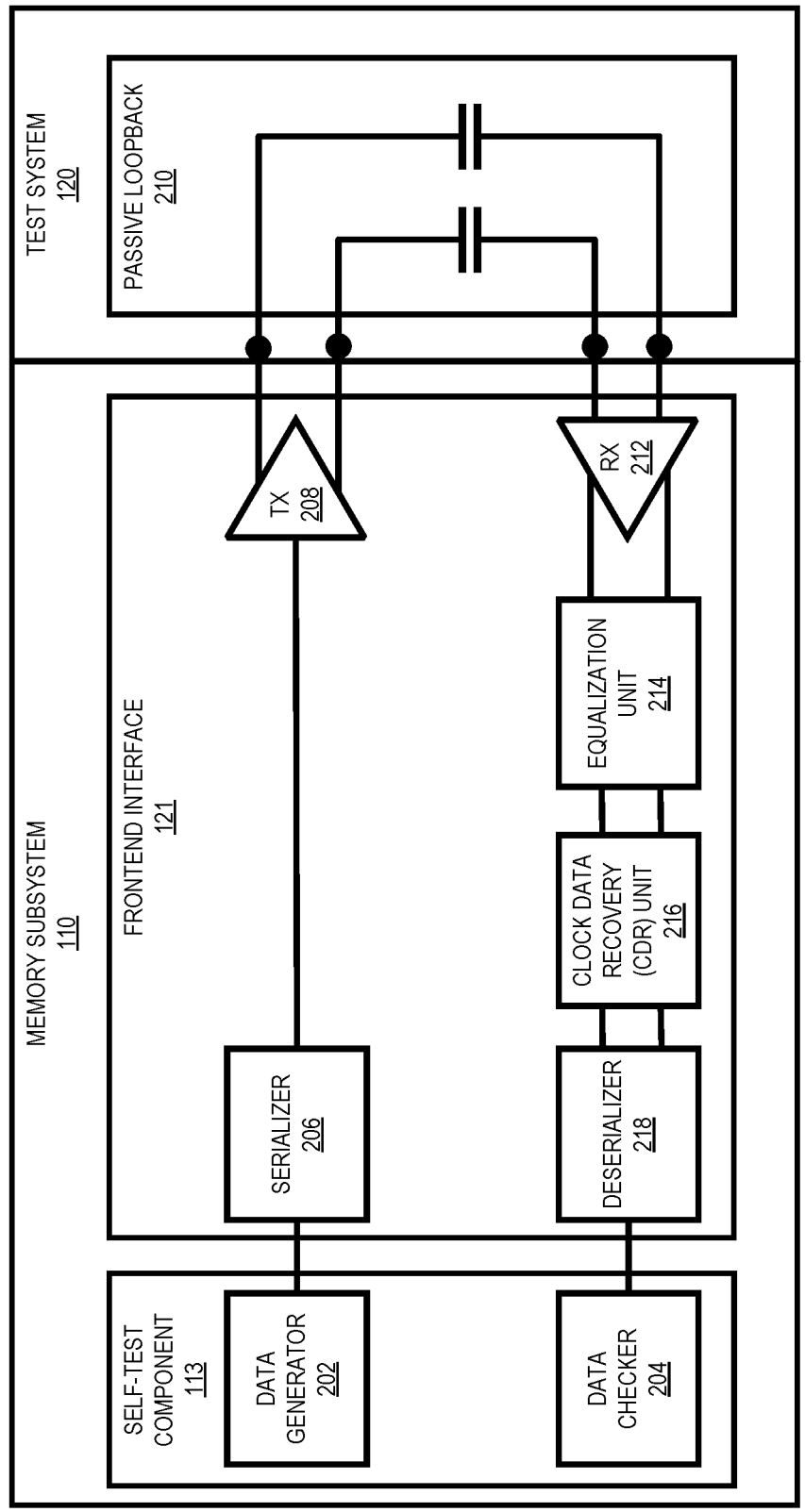
FIG. 2 shows an example configuration of the memory subsystem coupled with a test system using a passive loopback of the test system, in accordance with some embodiments of the present disclosure.

FIG. 2 shows an example configuration of the memory subsystem 110 coupled with the test system 120, according to one embodiment. As shown in FIG. 2, the self-test component 113 of the memory subsystem 110 includes a data generator 202 and a data checker 204. Using the data generator 202 and the data checker 204, the self-test component 113 can perform one or more tests for determining the functionality and/or performance of one or more components of the memory subsystem 110. For example, the tests can vary test data patterns to try to induce worst case jitter and voltage signaling scenarios to determine defects in the memory subsystem 110. To accomplish this goal, each test can include a set of operations to be performed by the device under test (i.e., the memory subsystem 110), data collection procedures (e.g., data points to collect during performance of the set of operations), and analysis criteria (e.g., comparisons performed on the collected data points for determining success or failure of the test). For example, the set of operations of a test can include the data generator 202 generating one or more test patterns in addition to various operations for enabling/disabling or otherwise configuring components of the memory subsystem 110 or the test system 120. In some embodiments, a test pattern generated by the data generator 202 is stored in a register or another storage location of the memory subsystem 110, awaiting transmission to the test system 120. For example, following generation, a test pattern is retrieved from a register of the memory subsystem 110 for processing by the serializer 206 of the frontend interface 121. The serializer 206 serializes the test pattern, which is originally represented in a data structure, into a serialized set of bits or bytes. The transmission (TX) unit 208 of the frontend interface 121 processes the serialized data for transmission to the test system 120. As shown, the transmission unit 208 is a differential interface that includes two complimentary output signals, which are received by the test system 120. However, in other embodiments, a single-ended signaling technique is used in place of the differential signaling technique shown in FIG. 2.

In the embodiment shown in FIG. 2, the test system 120 includes a passive loopback 210 for the signals received from the transmission unit 208 of the frontend interface 121. The passive loopback 210 feeds the serialized data back to the frontend interface 121 of the memory subsystem 110. In particular, the passive loopback 210 feeds a set of loopback signals representing the serialized data to the receiver (RX) unit 212 of the frontend interface 121.

As shown in FIG. 2, in some embodiments, equalization and/or retiming is performed on the set of loopback signals that represent the serialized data. Namely, the equalization unit 214 performs continuous time linear equalization (CTLE) on the set of loopback signals representing the serialized data to produce a set of equalized signals. As used herein, CTLE is a linear filter that attenuates low-frequency signal components, amplifies components around the Nyquist frequency, and filters off higher frequencies. CTLE gain can be adjusted to optimize the ratio of low frequency attenuation to high frequency amplification. In some embodiments, CTLE is performed with decision feedback equalization (DFE) to optimize CTLE performed by the equalization unit 214.

Following processing by the equalization unit 214, the clock data recovery (CDR) unit 216 performs CDR on the set of equalized signals to extract timing information and to generate a set of retimed signals. The retimed signals can be processed by the deserializer 218 to reveal a set of symbols/data representing deserialized data. The deserialized data can thereafter be passed to the data checker 204 to determine whether the memory subsystem 110 has passed the current test. For example, as noted above, each test can include a set of data collection procedures (e.g., data points to collect based on the deserialized data) and a set of analysis criteria (e.g., comparisons performed on the collected data points for determining success or failure of the test). For instance, using the original test pattern generated by the data generator 202, the data checker 204 can determine the bit error rate (BER) and compare this BER against a BER threshold to determine success or failure of the memory subsystem 110 relative to the test. A result of the test (e.g., a success/failure indicator and/or another quantification of the result of the test) can be stored in the memory subsystem 110 (e.g., in a register of the memory subsystem 110) for retrieval by the test system 120 or another device. For example, in some embodiments, a test device separate from the test system 120 is connected to the memory subsystem 110 via a serial connection separate from the passive loopback 210 such that the test device can access the location in the memory subsystem 110 where the result of the test is stored.

Figure 3:
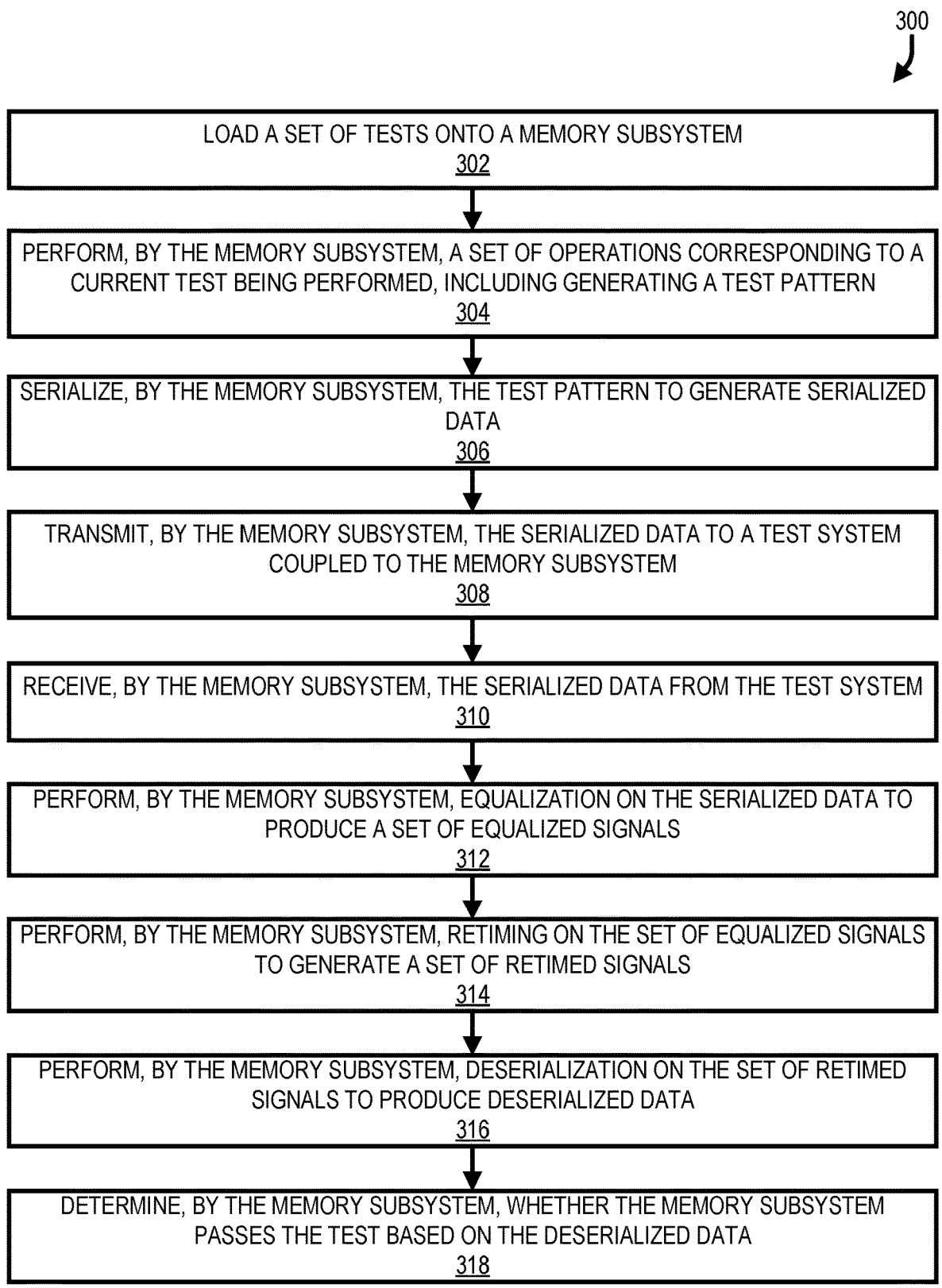
FIG. 3 shows a flow diagram of an example method to perform a self-test on the memory subsystem using the passive loopback of the test system, in accordance with some embodiments of the present disclosure.

FIG. 3 is a flow diagram of an example method 300 to perform a self-test on the memory subsystem 110 using the passive loopback 210 of the test system 120, in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the self-test component 113 and/or the passive loopback 210 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Accordingly, other process flows are possible.

As shown in FIG. 3, the method 300 commences at operation 302 with a processing device of the memory subsystem 110 loading a set of tests onto the memory subsystem 110. For example, a device can be connected to the memory subsystem 110 via a connection separate from the passive loopback 210 of the test system 120. The device can be separate from the test system 120 and can pass the set of tests to the memory subsystem 110 for storage in a location of the memory subsystem 110 (e.g., the local memory 119). Each test can be represented in a set of data structures and can include a set of operations to be performed by the device under test (i.e., the memory subsystem 110), data collection procedures (e.g., data to be generated and/or data points to collect during performance of the set of operations), and analysis criteria (e.g., comparisons performed on the collected data points for determining success or failure of the test).

At operation 304, the processing device of the memory subsystem 110 performs the set of operations corresponding to a current test being performed. For purposes of illustration, the method 300 will be described in relation to a single test of the set of tests originally loaded on the memory subsystem 110 at operation 302. However, the remaining operations of the method 300 (e.g., operations 304-320) can be performed for each test in the set of tests of operation 302.

In one embodiment, the set of operations of a test includes the data generator 202 generating one or more test patterns in addition to various operations for enabling/disabling or otherwise configuring components of the memory subsystem 110. For purposes of illustration, the example/current test described in relation to the method 300 includes generating a test pattern by the data generator 202. As described above, the tests can vary test patterns to try to induce worst case jitter and voltage signaling scenarios to determine defects in the memory subsystem 110.

At operation 306, the processing device of the memory subsystem 110 serializes the test pattern from operation 304 to produce serialized data. For example, the test pattern is retrieved from a register of the memory subsystem 110 for processing by the serializer 206 of the frontend interface 121. The serializer 206 serializes the test pattern to produce the serialized data (e.g., a serialized set of bits or bytes).

At operation 308, the processing device of the memory subsystem 110 transmits the serialized data to the test system 120. For example, the transmission unit 208 of the frontend interface 121 generates complimentary output signals, which are transmitted by the transmission unit 208 to the test system 120. In this example, the complimentary output signals represent the serialized data. Further, the transmission to the test system 120 is performed without compliance with a shared protocol between the test system and the memory subsystem 110. In particular, the complimentary output signals that represent the serialized data are electrical signals set according to the corresponding test and without material significance to the test system 120.

At operation 310, the processing device of the memory subsystem 110 receives serialized data from the test system 120. For example, the test system 120 includes the passive loopback 210 as shown in FIG. 2. The passive loopback 210 feeds a set of loopback signals representing the serialized data back to the frontend interface 121 of the memory subsystem 110. In particular, the passive loopback 210 feeds the complimentary set of loopback signals that represent the serialized data to the receiver unit 212 of the frontend interface 121.

At operation 312, the processing device of the memory subsystem 110 performs equalization on the serialized data received from the test system 120 to produce a set of equalized signals. For example, the equalization unit 214 can perform CTLE in conjunction with DFE on the set of signals that represent the serialized data to produce the set of equalized signals.

At operation 314, the processing device of the memory subsystem 110 performs retiming of the set of equalized signals to generate a set of retimed signals. For example, the CDR unit 216 performs CDR on the set of equalized signals to extract timing information that is used by the CDR unit 216 to generate a set of retimed signals.

At operation 316, the processing device of the memory subsystem 110 performs deserialization of the set of retimed signals to produce deserialized data. For example, the deserializer 218 performs deserialization of the set of retimed signals from operation 312 to generate deserialized data.

At operation 318, the processing device of the memory subsystem 110 determines whether the memory subsystem 110 passes the current test based on the deserialized data. For example, as noted above, each test can include a set of data collection procedures (e.g., data points to collect based on the deserialized data) and a set of analysis criteria (e.g., comparisons performed on the collected data points for determining success or failure of the test). For instance, knowing the original test pattern, the data checker 204 determines the bit error rate (BER) between the original test pattern and the deserialized data and compares this BER with a BER threshold to determine success or failure of the memory subsystem 110 relative to the test. When the BER of the current test is higher than a threshold, the memory subsystem 110 fails the test. In contrast, when the BER of the current test is less than or equal to a threshold, the memory subsystem 110 passes the test (i.e., the test is a success). A result of the test (e.g., a pass/failure indicator and/or another quantification of the result of the test) can be stored in the memory subsystem 110 at operation 318 (e.g., in a register of the memory subsystem 110) for retrieval by the test system 120 or another device. For example, another test device can be connected to the memory subsystem 110 via a connection separate from the passive loopback 210 such that the test device can access the location in the memory subsystem 110 where the result of the test is stored.

As described above, the configuration of the memory subsystem 110 and the test system 120 shown in FIG. 2 provides a low cost (both in terms of financial and implementation/complexity costs) test environment that does not require the test system 120 to support/implement a protocol of the memory subsystem 110. In particular, the test system 120 is merely required to provide power and corresponding passive circuitry to support the passive loopback 210.

Figure 4:
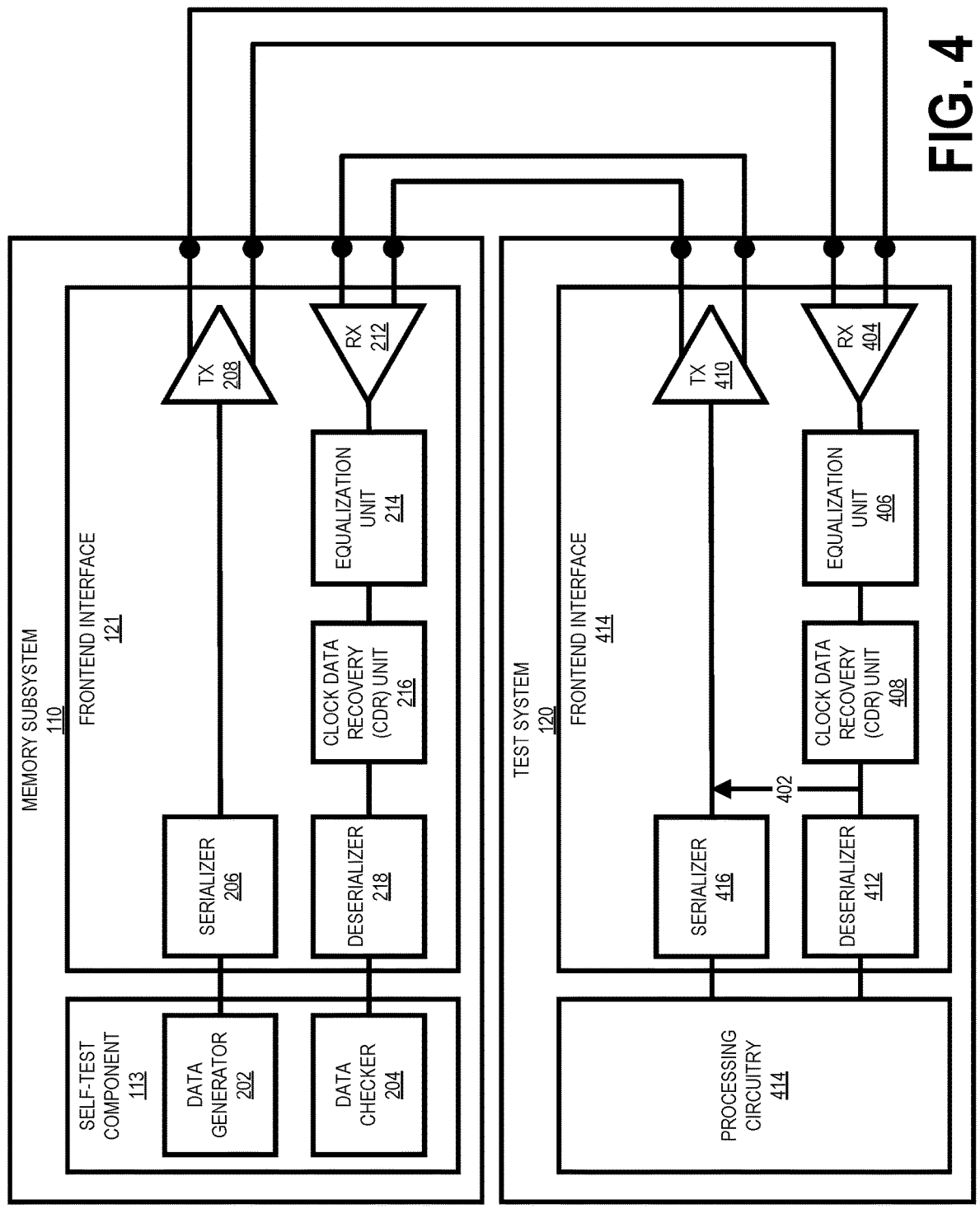
FIG. 4 shows an example configuration of the memory subsystem coupled with the test system using a retimed loopback of the test system, in accordance with some embodiments of the present disclosure.

FIG. 4 shows an example configuration of the memory subsystem 110 coupled with the test system 120, according to another embodiment. In comparison to the configuration shown in FIG. 2 in which a passive loopback 210 is employed, the configuration, the embodiment shown in FIG. 4 employs a retimed loopback 402 (i.e., an active/dynamic loopback). Namely, the set of signals that represent the serialized data received from the memory subsystem 110 are processed by the test system 120 before being returned to the memory subsystem 110. For example, as shown in FIG. 4, the set of signals that represent serialized data of a test pattern are received by the receiver 404, equalized by an equalization unit 406 (e.g., CTLE and/or DFE), and retimed by a CDR unit 408 before being returned to the memory subsystem 110 via the retimed loopback 402 and the transmitter 410. In one embodiment, a set of operations for a test can include enabling the retimed loopback 402 in the test system 120 (e.g., the memory subsystem 110 transmits a command to the test system 120 to enable the retimed loopback 402). In this embodiment, when the retimed loopback 402 is enabled in the test system 120, one or more other components of the test system 120 are disabled to prevent collisions of data/signals on the transmission/loopback path. For example, the deserializer 412, the processing circuitry 414, and the serializer 416 of the test system 120 are disabled in response to the retimed loopback 402 being enabled. When the retimed loopback 402 is disabled, retimed signals from the CDR unit 408 are processed by the deserializer 412, the processing circuitry 414, and the serializer 416 of the test system 120.

Although the retimed loopback 402 is shown starting before the deserializer 412 and extending after the serializer 416, in other embodiments, the retimed loopback 402 can extend after the deserializer 412 and before the serializer 416 such that the retimed signals from the CDR unit 408 are deserialized by the deserializer 412 and reserialized by the serializer 416. Accordingly, the placement of the retimed loopback 402 can be moved in different embodiments.

Figure 5A:
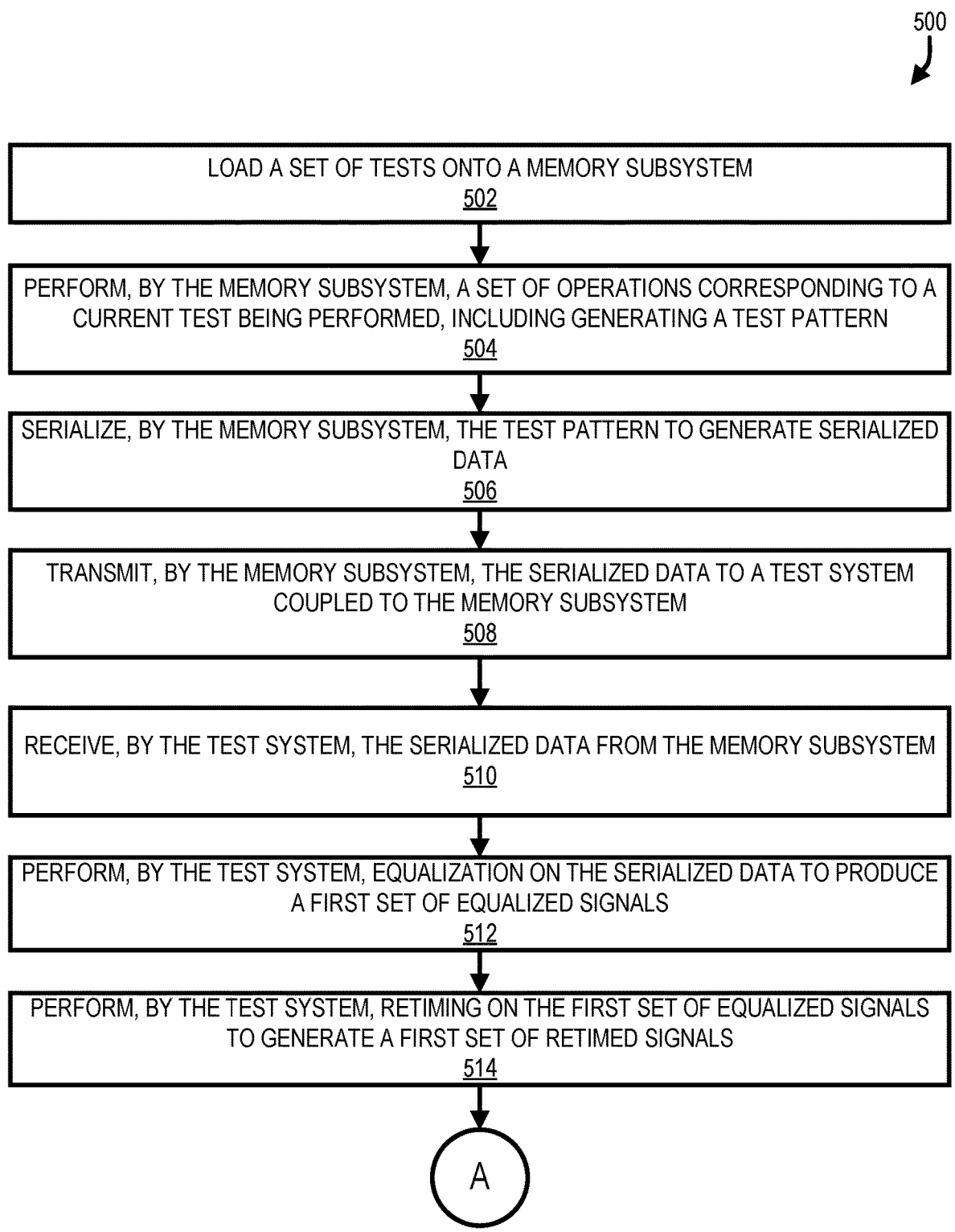
FIGS. 5A and 5B shows a flow diagram of an example method to perform a self-test on the memory subsystem using the retimed loopback of the test system, in accordance with some embodiments of the present disclosure.
Figure 5B:
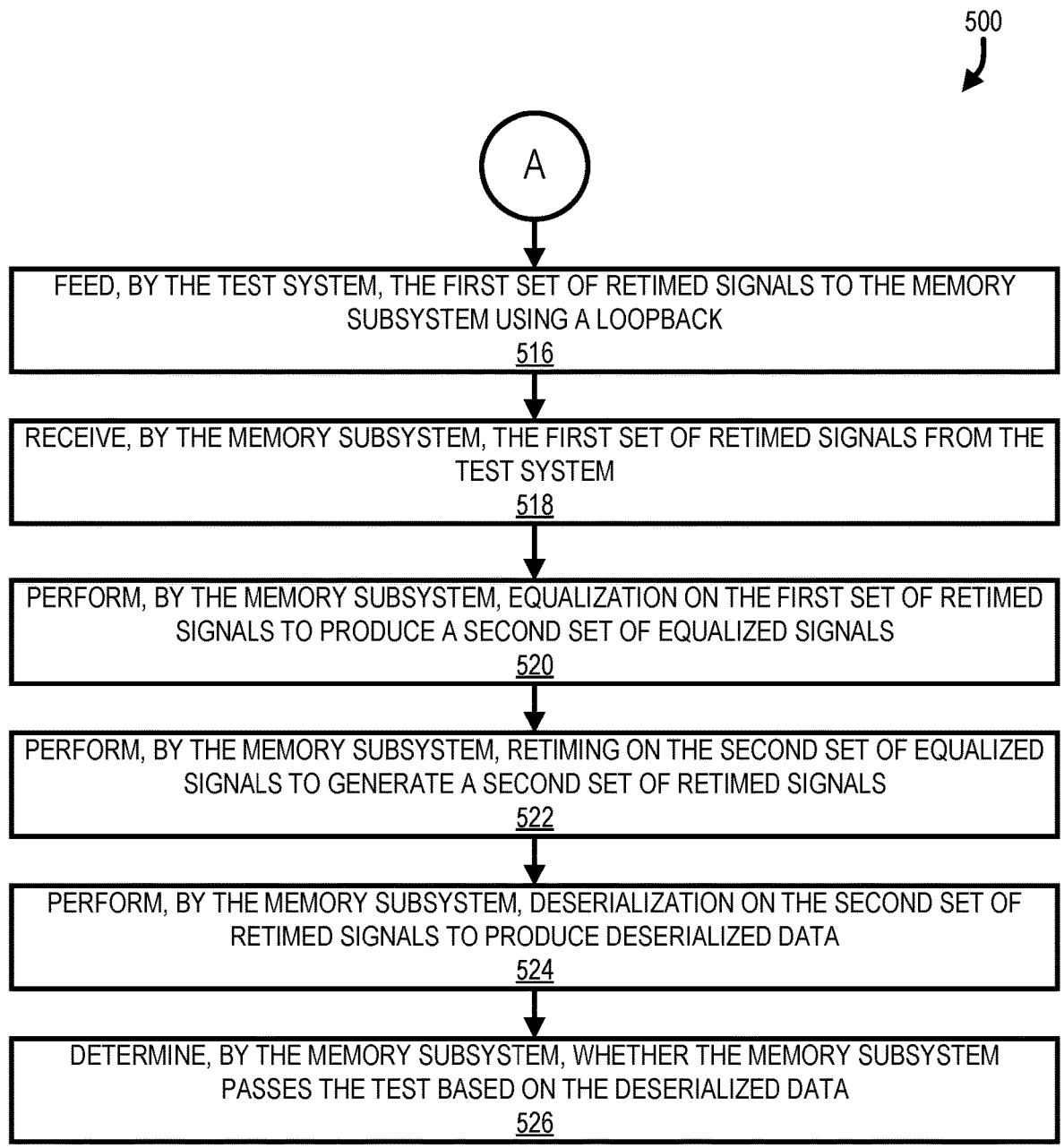

FIG. 5A and FIG. 5B shows a flow diagram of an example method 500 to perform a self-test on the memory subsystem 110 using the retimed loopback 402 of the test system 120, in accordance with some embodiments of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the self-test component 113 and/or the retimed loopback 402 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, operations 502-508 of the method 500 are similar to the operations 302-308 of the method 300, respectively. Accordingly, the method 500 produces serialized data for transmission to the test system 120 in a similar fashion as the method 300. Although similar, the operations 502-508 can include differences in comparison to the operations 302-308. For example, since a passive loopback, which cannot be disabled/enabled, is no longer employed by the test system 120 (e.g., the passive loopback 210 is not used by the test system 120), in some embodiments, one or more operations in a set of operations of a test that are performed at operation 504 include enabling the retimed loopback 402 in the test system 120.

At operation 510, the processing device of the test system 120 receives the serialized data from the memory subsystem 110. For example, the memory subsystem 110 feeds complimentary signals that represent the serialized data to the receiver unit 404 of the frontend interface 414 of the test system 120.

At operation 512, the processing device of the test system 120 performs equalization on the serialized data received from the memory subsystem 110 to produce a first set of equalized signals. For example, the equalization unit 406 performs CTLE in conjunction with DFE on the set of signals that represent the serialized data to produce the first set of equalized signals.

At operation 514, the processing device of the test system 120 performs retiming of the first set of equalized signals to generate a first set of retimed signals. For example, the CDR unit 408 performs CDR on the first set of equalized signals to extract timing information that is used by the CDR unit 408 to generate a first set of retimed signals.

At operation 516, a processing device of the test system 120 feeds the first set of retimed signals to the memory subsystem 110 using the retimed loopback 402. In particular, the test system 120 includes the retimed loopback 402 as shown in FIG. 4. The retimed loopback 402 feeds the set of retimed signals back to the receiver unit 212 of the memory subsystem 110.

At operation 518, the processing device of the memory subsystem 110 receives the set of retimed signals from the test system 120. For example, as noted above, the retimed loopback 402 of the test system 120 feeds the first set of retimed signals to the receiver unit 212 of the memory subsystem 110.

At operation 520, the processing device of the memory subsystem 110 performs equalization on the first set of retimed signals received from the test system 120 to produce a second set of equalized signals. For example, the equalization unit 214 performs CTLE in conjunction with DFE on the first set of retimed signals to produce the second set of equalized signals.

At operation 522, the processing device of the memory subsystem 110 performs retiming of the second set of equalized signals to generate a second set of retimed signals. For example, the CDR unit 216 performs CDR on the second set of equalized signals to extract timing information that is used by the CDR unit 216 to generate the second set of retimed signals.

At operation 524, the processing device of the memory subsystem 110 performs deserialization of the new set of retimed signals to produce deserialized data. For example, the deserializer 218 performs deserialization of the new set of retimed signals from operation 522 to generate deserialized data.

At operation 526, the processing device of the memory subsystem 110 determines whether the memory subsystem 110 passes the current test based on the deserialized data. In some embodiments, operation 526 is performed in a similar or identical fashion to operation 318 of the method 300.

Figure 6:
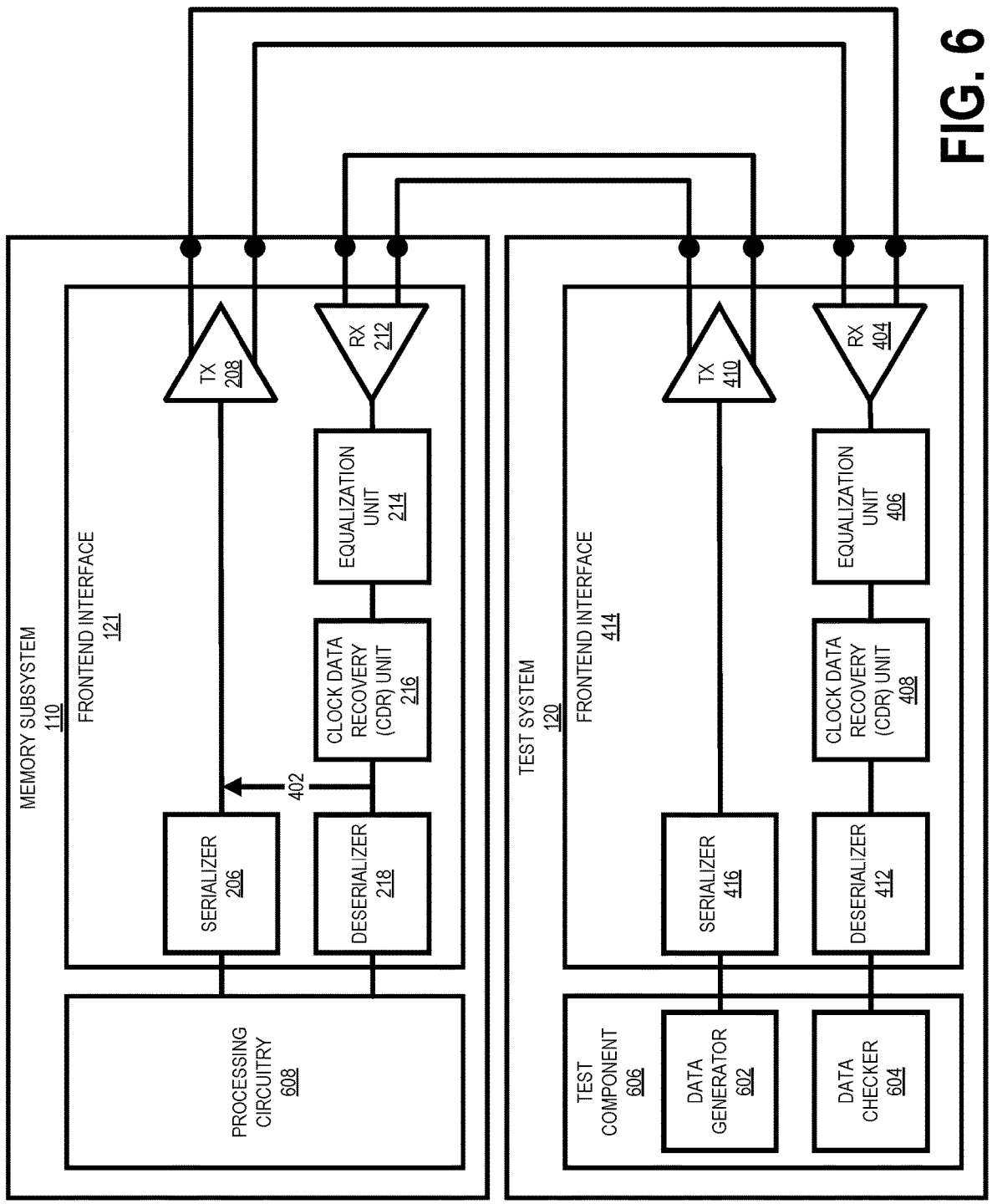
FIG. 6 shows an example configuration of the memory subsystem coupled with a test system using a passive loopback of the memory subsystem, in accordance with some embodiments of the present disclosure.

FIG. 6 shows an example configuration of the memory subsystem 110 coupled with the test system 120, according to another embodiment. In comparison to the configurations shown in FIG. 2 and FIG. 4 in which loopbacks are employed in the test system 120, the configuration in FIG. 6 employs a loopback in the memory subsystem 110. In particular, the retimed loopback 402 is located in the memory subsystem 110 in FIG. 6 instead of in the test system 120 as shown in FIG. 4. Accordingly, the set of tests are instead stored in the test system 120 such that corresponding operations of the set of tests are performed/initiated by the test system 120 instead of the memory subsystem 110. For example, as shown in FIG. 6, the data generator 602 of the test component 606 generates a test pattern that is passed to the serializer 416. The serializer 416 serializes the test pattern, which is originally represented in a data structure, into a serialized set of bits or bytes. The transmission (TX) unit 410 of the frontend interface 414 of the test system 120 processes the serialized data for transmission to the memory subsystem 110. A set of signals that represent serialized data of a test pattern are received by the receiver 212, equalized by an equalization unit 214 (e.g., CTLE and/or DFE) and retimed by a CDR unit 216 before being returned to the test system 120 via the retimed loopback 402 and the transmitter 208 of the memory subsystem 110. In one embodiment, a set of operations for a test includes enabling the retimed loopback 402 in the memory subsystem 110 (e.g., the test system 120 transmits a command to the memory subsystem 110 to enable the retimed loopback 402). In this embodiment, when the retimed loopback 402 is enabled in the memory subsystem 110, one or more other components of the memory subsystem 110 are disabled to prevent collisions of data/signals on the transmission/loopback path. For example, the deserializer 218, the processing circuitry 608, and the serializer 206 of the memory subsystem 110 are disabled in response to the retimed loopback 402 being enabled. When the retimed loopback 402 is disabled, retimed signals from the CDR unit 216 are processed by the deserializer 218, the processing circuitry 608, and the serializer 206 of the memory subsystem 110.

Although the retimed loopback 402 is shown starting before the deserializer 218 and extending after the serializer 206, in other embodiments, the retimed loopback 402 can extend after the deserializer 218 and before the serializer 206 such that the retimed signals from the CDR unit 216 are deserialized by the deserializer 218 and reserialized by the serializer 206. Accordingly, the placement of the retimed loopback 402 can be moved in different embodiments of the memory subsystem 110.

The above test system 120 initiating testing ensures that test patterns/signals are consistently applied across devices under test. In particular, some devices under test (e.g., some memory subsystems 110) may not be able to output the patterns/signals indicated by a particular test. Accordingly, there is no assurance that the test will be consistently conducted across devices under test. In contrast, by the test system 120 initiating the test, a test engineer can ensure that the test system 120 is capable of outputting patterns/signals indicated by the test such that the test is uniformly performed across devices under test.

Figure 7:
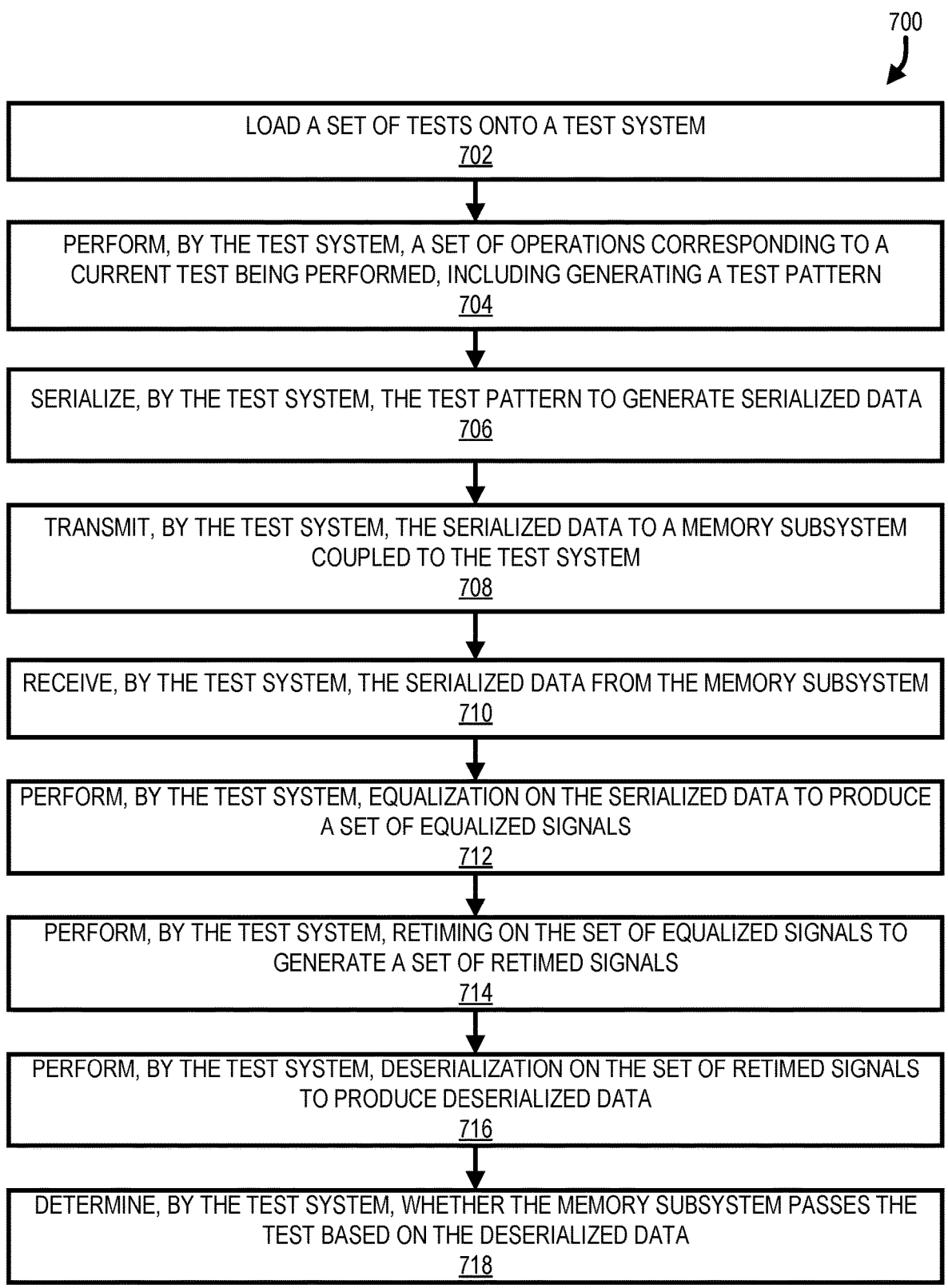
FIG. 7 shows a flow diagram of an example method to perform a self-test on the memory subsystem using the retimed loopback of the memory subsystem, in accordance with some embodiments of the present disclosure.

In some embodiments, a method similar to the method 300 may be performed using the configuration of the memory subsystem 110 and the test system 120 shown in FIG. 7. For example, FIG. 7 shows an example method 700 that is based on the method 300. As shown in FIG. 7, for the operations 702-718, the method 700 reverses the memory subsystem 110 and the test system 120 actors to perform testing on the memory subsystem 110.

Figure 8:
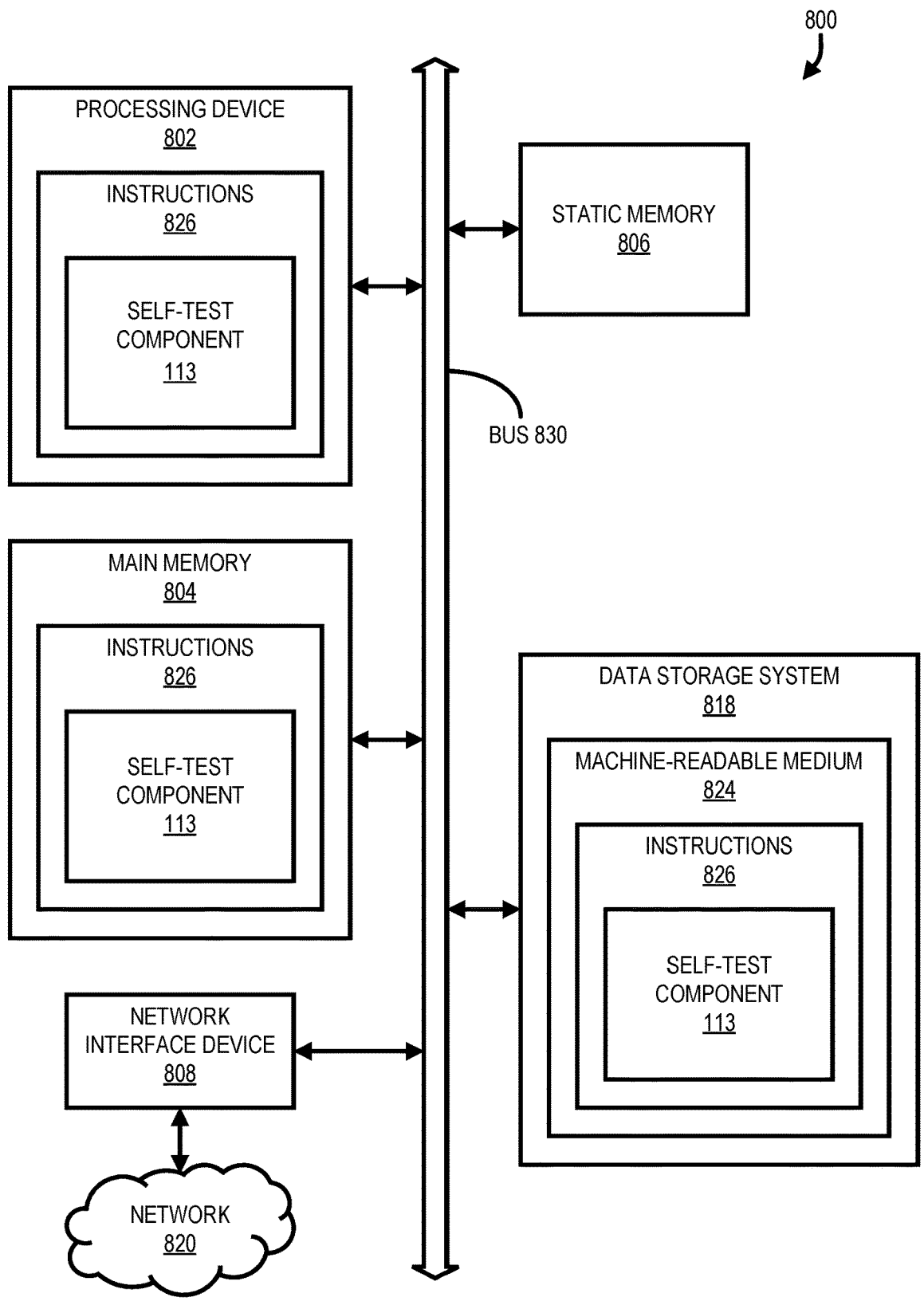
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 corresponds to a test system (e.g., the test system 120 of FIG. 1) that is coupled to a memory subsystem (e.g., the memory subsystem 110 of FIG. 1) or can be used to perform the operations of a controller (e.g., to execute an operating system to perform operations corresponding to the self-test component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. In some embodiments, the machine-readable storage medium 824, data storage system 818, and/or main memory 804 correspond to the memory subsystem 110 of FIG. 1.

In one embodiment, the instructions 826 include instructions to implement functionality corresponding to a self-test component (e.g., the self-test component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300, 500, and 700 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device under test for performing built-in self-tests to determine the functionality of one or more components of the device under test, the device under test comprising:
　　a storage location to store a set of tests for testing the device under test;

a data generator to generate a test pattern based on a test in the set of tests;

a transmission unit to transmit the test pattern to a test system, wherein the transmission unit of the device under test is physically coupled to the test system via a first physical interface for transmission of the test pattern;

a receiver unit to receive a set of loopback signals from the test system, wherein the set of loopback signals represents the test pattern and is received from the test system via a second physical interface that physically couples the device under test to the test system; and a data checker to determine success or failure of the device under test based on the set of loopback signals.

2. The device under test of claim 1, wherein each test in the set of tests includes a set of operations to be performed by the device under test.

3. The device under test of claim 2, wherein the set of operations for the test in the set of tests includes generating the test pattern.

4. The device under test of claim 3, wherein the set of operations for the test in the set of tests includes transmitting a loopback enable signal to the test system to (1) enable a loopback in the test system that causes the test system to route the set of loopback signals representing the test pattern to the device under test and (2) disable one or more other components of the test system.

5. The device under test of claim 4, further comprising:

an equalization unit for equalizing the set of loopback signals received from the test system to produce a set of equalized signals; and a clock data recovery unit to retime the set of equalized signals to produce a set of retimed signals, wherein the one or more other components of the test system include the equalization unit and the clock data recovery unit.

6. The device under test of claim 5, wherein the data checker determines success or failure of the device under test for the test based on the set of retimed signals.

7. The device under test of claim 1, wherein the test pattern is transmitted to the test system without compliance with a protocol between the test system and the device under test.

8. A test system to determine the functionality of a device under test, the test system comprising:

a receiver unit to receive data from the device under test via a first physical interface that couples the device under test to the test system;

a transmission unit to transmit data to the device under test via a second physical interface that couples the device under test to the test system;

a loopback coupling the receiver unit to the transmission unit, wherein the loopback is enabled to pass a set of loopback signals, which are based on a set of test signals received from the device under test and represent a test pattern for testing a component of the device under test, from the receiver unit to the transmission unit such that the set of loopback signals are passed to the device under test via the transmission unit and a second physical interface that couples the device under test to the test system; and a set of processing circuitry for processing transmissions received from the device under test, wherein the test system is configured to receive a loopback enable signal to (1) enable the loopback such that the set of test signals from the device under test avoid the set of processing circuitry and (2) disable the set of processing circuitry, and wherein the test system is configured to receive a loopback disable signal to (1) disable the loopback such that the set of test signals from the device under test are processed by the set of processing circuitry and (2) enable the set of processing circuitry.

9. The test system of claim 8, wherein the set of processing circuitry includes:

an equalization unit for equalizing the set of test signals received from the device under test to produce a set of equalized signals; and a clock data recovery unit to retime the set of equalized signals to produce a set of retimed signals.

10. The test system of claim 9, wherein the set of loopback signals are the set of retimed signals.

11. The test system of claim 8, wherein the loopback is a passive circuit coupling the receiver unit to the transmission unit.

12. The test system of claim 11, wherein the passive circuit is a set of capacitors.

13. The test system of claim 11, wherein the set of loopback signals are the set of test signals.

14. The test system of claim 8, wherein the device under test is a memory subsystem that includes a set of memory components to store data.

15. A method to determine the functionality of a device under test, the method comprising:

enabling a loopback in a test system, wherein the device under test is physically coupled to the test system via a first physical interface and a second physical interface and a loopback enable signal is transmitted to the test system to enable the loopback via the first physical interface and disable a set of processing circuitry;

transmitting a set of test signals to the test system via the first physical interface, wherein the set of test signals represent a test pattern of a test for testing a component of the device under test;

receiving a set of loopback signals via the second physical interface, based on the set of test signals and representing the test pattern for testing the component of the device under test, via the loopback that couples a receiver unit and a transmission unit of the device under test; and determining whether the device under test passes the test based on the set of loopback signals.

16. The method of claim 15, further comprising:

equalizing the set of test signals received from the test system to produce a set of equalized signals; and retiming the set of equalized signals to produce a set of retimed signals.

17. The method of claim 16, wherein the set of loopback signals are the set of retimed signals.

18. The method of claim 15, wherein the loopback is a passive circuit coupling the receiver unit to the transmission unit.

* * * * *